(12) United States Patent
Seo

(10) Patent No.: US 7,053,656 B2
(45) Date of Patent: May 30, 2006

(54) LEVEL SHIFTER UTILIZING INPUT CONTROLLED ZERO THRESHOLD BLOCKING TRANSISTORS

(75) Inventor: Jin-Ho Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/859,952

(22) Filed: Jun. 3, 2004

(65) Prior Publication Data
US 2005/0134312 A1 Jun. 23, 2005

(30) Foreign Application Priority Data
Dec. 17, 2003 (KR) .................. 10-2003-0092231

(51) Int. Cl.
*H03K 19/0175* (2006.01)
*H03K 19/094* (2006.01)

(52) U.S. Cl. ................ 326/68; 327/538; 326/81
(58) Field of Classification Search .......... 326/68, 326/81; 341/135; 327/538, 333
See application file for complete search history.

(56) References Cited

U.S. PATENT DOCUMENTS 6,556,061 B1 * 4/2003 Chen et al. ............. 327/333
6,650,168 B1 * 11/2003 Wang et al. ............. 327/333
2004/0056708 A1 * 3/2004 Bedarida et al. ......... 327/538

FOREIGN PATENT DOCUMENTS

JP 7096913 3/1995
JP 10-084274 3/1998

OTHER PUBLICATIONS

Bernstein et al. "Chapter 6: Interface Techniques," *High Speed CMOS Design Styles*. 1998, pp 207-246, no month.

* cited by examiner

*Primary Examiner*—Peguy JeanPierre
(74) *Attorney, Agent, or Firm*—Myers Bigel Sibley & Sajovec, P.A.

(57) ABSTRACT

Level shifter circuits include zero threshold transistors that reduce a voltage seen by a switching transistor of the level shifter circuits and may increase blocking of static current in the level shifter circuit. The zero threshold transistors are controlled based on the input to the level shifter circuit. Thin oxide transistors may be used to provide low threshold voltages for the switching transistors. Additional level shifter circuits include serially connected zero threshold transistors that act as switching transistors in a current mirror or latch-type level shifter circuit.

23 Claims, 9 Drawing Sheets

LEVEL SHIFTER UTILIZING INPUT CONTROLLED ZERO THRESHOLD BLOCKING TRANSISTORS

CLAIM OF PRIORITY

This application claims priority from Korean Patent Application No. 10-2003-0092231, filed on Dec. 17, 2003, in the Korean Intellectual Property Office, the contents of which are hereby incorporated by reference in their entirety as if set forth fully herein.

FIELD OF THE INVENTION

The present invention relates to level shifters and, more particularly, to level shifters capable of operating with technology having a very low core voltage.

BACKGROUND OF THE INVENTION

When connecting circuits having different power source voltages, the level of an output signal of one circuit should be shifted to the level of the other circuit receiving the output signal. In general, a level shifter accomplishes this task. As seen in FIGS. 1A and 1B, a conventional level shifter typically includes inverters and four transistors MN11, MN12, MP11, and MP12. The transistors MP11 and MP12 are p-channel MOS (PMOS) transistors, and the transistors MN11 and MN12 are n-channel MOS (NMOS) transistors. Level shifters may be characterized based on the interconnection of the transistors as either a latch-type level shifter (FIG. 1A) or a mirror-type level shifter (FIG. 1B).

Because of the cross coupled structure of the transistors MP11 and MP12, there is no static current (i.e. a current through the transistors MP11 or MP12 when the output of the level shifter is in a steady state) in the latch-type level shifter illustrated in FIG. 1A. In particular, when the transistor MN11 is on and the transistor MN12 is off, the gate of the transistor MP12 is pulled low and the transistor MP12 is on, which pulls the gate of the transistor MP11 high and turns off the transistor MP11. When the transistor MN11 is off and the transistor MN12 is on, the gate of the transistor MP11 is pulled low and the transistor MP11 is on, which pulls the gate of the transistor MP12 high and turns off the transistor MP12. Thus, a current path is not formed through either transistors MP11 and MN11 or MP12 and MN12.

However, the performance of the latch-type level shifter is strongly affected by the voltage of vdd2, since the gate-to-source voltage of PMOS transistors MP11 and MP12 is the voltage vdd2, whereas the gate-to-source voltage of NMOS transistors MN11 and MN12 is the voltage vdd1. Thus, the range of voltages of vdd2 over which a latch-type level shifter may function properly may be narrow.

A mirror-type level shifter is illustrated in FIG. 1B. As seen in FIG. 1B, the gates of the PMOS transistors MP11 and MP12 are coupled together and to the drain of the transistor MP11. Because the performance is determined by the current of the transistors MP11 and MN11, even if the output voltage vdd2 is changed, there will typically be no severe performance change in the level shifter. Thus, it may be possible to use the mirror-type level shifter for various output voltage circuits. However, when MN11 is on, the gates of the transistors MP11 and MP12 are pulled low and the transistors MP11 and MP12 are on. Thus, a static current path is formed through the transistors MP11 and MN11.

A further difficulty in providing level shifter circuits is that the core supply voltage (vdd1) used in, for example, ultra deep submicron CMOS technologies, is reduced, while the I/O section supply voltage (vdd2) is kept at a high level. As the core supply voltage vdd1 is reduced, the gate-source voltage driving the NMOS transistor NM11, NM12 is also reduced. Thus, the driving capability may be reduced to a point where the level shifter does not provide reliable operation.

For example, as the core voltage (vdd1) decreases and the difference of vdd1 and threshold voltage ($V_{thn}$) of the NMOS transistors is lowered to nearly zero, the level shifter may not provide reliable operation. In particular, the current ($I_{MN12}$) of the transistor MN12 is provided by the following equation:

$$I_{MN12} = \frac{\mu_N C_{OX}}{2} \left(\frac{W}{L}\right)_{MN12} (vdd1 - V_{thn})^2$$

where W and L are the gate width and length, $C_{OX}$ is the oxide capacitance and $\mu_N$ is the surface electron mobility. As is seen from the above equation, as the difference between vdd1 and the threshold voltage $V_{thn}$ approaches zero, the current through the transistor also approaches zero. To overcome this limitation, the difference between vdd1 and the threshold voltage $V_{thn}$ may be increased by decreasing the threshold voltage $V_{thn}$. However, to reduce the threshold voltage, the transistors typically utilize thin oxides and shallow implants. Such a thin oxide transistor may be more susceptible to voltage stress when operated in conjunction with the higher voltage vdd2.

FIG. 2 is a circuit diagram of a level shifter such as described in Japanese Patent Application No. JP7086913. As seen in FIG. 2, a delay element provided by the inverters INV1 and INV2 and a transistor MP13 is provided in addition to a conventional current-mirror level shifter circuit. The transistor MP13 is placed in series with the transistors MP11 and MN11 and is controlled by the output of the delay element. The feedback signal from Y is used to control the transistor MP13 to block the static current when A is high.

FIG. 3 is a schematic diagram of a level shifter circuit as described in U.S. Pat. No. 6,556,061. As seen in FIG. 3, zero threshold transistors MN31 and MN32 have been incorporated in a conventional latch-type level shifter. The gates of the transistors MN31 and MN32 are tied to vdd1 (the lower voltage supply). The transistors MN11 and MN12 are thin oxide transistors that have a lower threshold voltage. Because the gate voltage of MN31 and MN32 is vdd1 and the threshold voltage of MN31 and MN32 is zero, the maximum drain voltage of MN11 and MN12 is vdd1 i.e. Vg−Vthn=Vdd1−0). Therefore, it is possible to use low threshold voltage transistors for MN11 and MN12.

SUMMARY OF THE INVENTION

Some embodiments of the present invention provide a level shifter for shifting an input signal from a first power domain having a first supply voltage to a second power domain having a second supply voltage. The level shifter includes a current mirror circuit that provides an output signal in the second power domain. The current mirror circuit includes first and second p-type transistors coupled to the second supply voltage, first and second zero threshold n-type transistors coupled to respective ones of the first and second p-type transistors and first and second n-type transistors coupled to respective ones of the first and second p-type transistors through respective ones of the first and second zero threshold transistors. The first and second n-type transistors have a threshold voltage based on the first supply voltage. A switching control circuit utilizing the first supply voltage controls the first zero threshold transistor responsive to the input signal to reduce static current through the first n-type transistor.

In further embodiments of the present invention, the switching control circuit includes a delay circuit configured to delay the input signal to provide a delayed input signal to control the first zero threshold transistor. The level shifter may also include a first inverter utilizing the first supply voltage and configured to receive the input signal and provide an inverted input signal to the first n-type transistor, a second inverter utilizing the first supply voltage and configured to receive the inverted input signal and provide a buffered input signal to the second n-type transistor and a third inverter utilizing the second supply voltage and to provide the output signal. The delay circuit may include at least two series inverters utilizing the first supply voltage.

In additional embodiments of the present invention, the delay circuit includes a fourth inverter utilizing the first supply voltage and configured to receive the input signal and provide a second inverted input signal and a NOR gate utilizing the first supply voltage and configured to receive the input signal and the second inverted input signal and provide a logical NOR of the input signal and the second inverted input signal to the first zero threshold transistor.

In still further embodiments of the present invention, a third p-type transistor has a gate coupled to the output of the third inverter and couples the second supply voltage to the input of the third inverter.

In further embodiments of the present invention, a fourth p-type transistor has a gate coupled to the input of the third inverter and couples the second supply voltage to the gates of the first and second p-type transistors.

In yet other embodiments of the present invention, a gate of the second zero threshold transistor is coupled to the output of the second inverter. Alternatively, the gate of the second zero threshold transistor may be coupled to the first supply voltage.

In additional embodiments of the present invention, the delay circuit has a delay corresponding to a delay between a transition in the input signal and a corresponding transition in the output signal. The delay circuit may also have a delay corresponding to a delay between a transition in an output of the first inverter and a corresponding transition in the output signal.

In other embodiments of the present invention, a voltage between the source and drain of the first and second n-type transistors is limited to the first supply voltage minus a threshold voltage of the corresponding first and second zero threshold transistors.

In additional embodiments of the present invention, a level shifter for shifting an input signal from a first power domain having a first supply voltage to a second power domain having a second supply voltage includes first and second cross-coupled p-type transistors coupled to the second supply voltage, first and second zero threshold n-type transistors serially coupled to the first p-type transistor and responsive to an inverted input signal and third and fourth zero threshold n-type transistors serially coupled to the second p-type transistor and responsive to a buffered input signal. A gate oxide of the first and second cross-coupled p-type transistors and the first, second, third and fourth zero threshold transistors may be substantially the same. The level shifter may also include a first inverter utilizing the first supply voltage and configured to receive the input signal and provide the inverted input signal to the first and second zero threshold transistors, a second inverter utilizing the first supply voltage and configured to receive the inverted input signal and provide the buffered input signal to the third and fourth zero threshold transistors and a third inverter utilizing the second supply voltage and configured to provide the output signal.

In other embodiments of the present invention, a level shifter for shifting an input signal from a first power domain having a first supply voltage to a second power domain having a second supply voltage includes first and second p-type transistors coupled to the second supply voltage having connected gate electrodes, first and second zero threshold n-type transistors serially coupled to the first p-type transistor and responsive to an inverted input signal and third and fourth zero threshold n-type transistors serially coupled to the second p-type transistor and responsive to a buffered input signal. A switching control circuit utilizing the first supply voltage controls the first zero threshold transistor responsive to the input signal.

In further embodiments of the present invention, a gate oxide of the first and second cross-coupled p-type transistors and the first, second, third and fourth zero threshold transistors is substantially the same. The level shifter may also include a first inverter utilizing the first supply voltage and configured to receive the input signal and provide an inverted input signal to the first and second zero threshold transistors, a second inverter utilizing the first supply voltage and configured to receive the inverted input signal and provide a buffered input signal to the third and fourth zero threshold transistors and a third inverter utilizing the second supply voltage and to provide the output signal.

In yet other embodiments of the present invention, the switching control circuit includes at least two series inverters utilizing the first supply voltage. The switching control circuit may also include a fourth inverter utilizing the first supply voltage and configured to receive the input signal and provide a second inverted input signal and a NOR gate utilizing the first supply voltage and configured to receive the input signal and the second inverted input signal and provide a logical NOR of the input signal and the second inverted input signal to the first zero threshold transistor.

In still other embodiments of the present invention, a third p-type transistor has a gate coupled to the output of the third inverter and couples the second supply voltage to the input of the third inverter.

In still further embodiments of the present invention, a fourth p-type transistor has a gate coupled to the input of the third inverter and couples the second supply voltage to the gates of the first and second p-type transistors.

In further embodiments of the present invention, the switching control circuit includes a delay circuit that has a delay corresponding to a delay between a transition in the input signal and a corresponding transition in the output signal.

DETAILED DESCRIPTION OF THE INVENTION

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

It will be understood that although the terms first and second may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, for example, a first element, component, region, layer, or section discussed below could be termed a second element, component, region, layer, or section without departing from the teachings of the present invention.

Figure 1A:
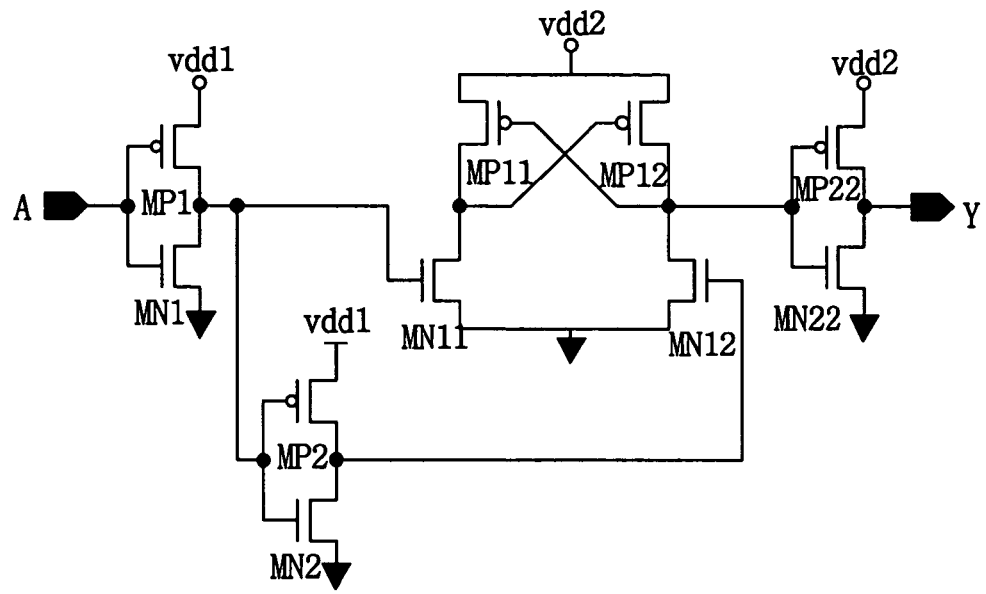
FIGS. 1A and 1B are schematic illustrations of conventional level shifter circuits.
Figure 1B:
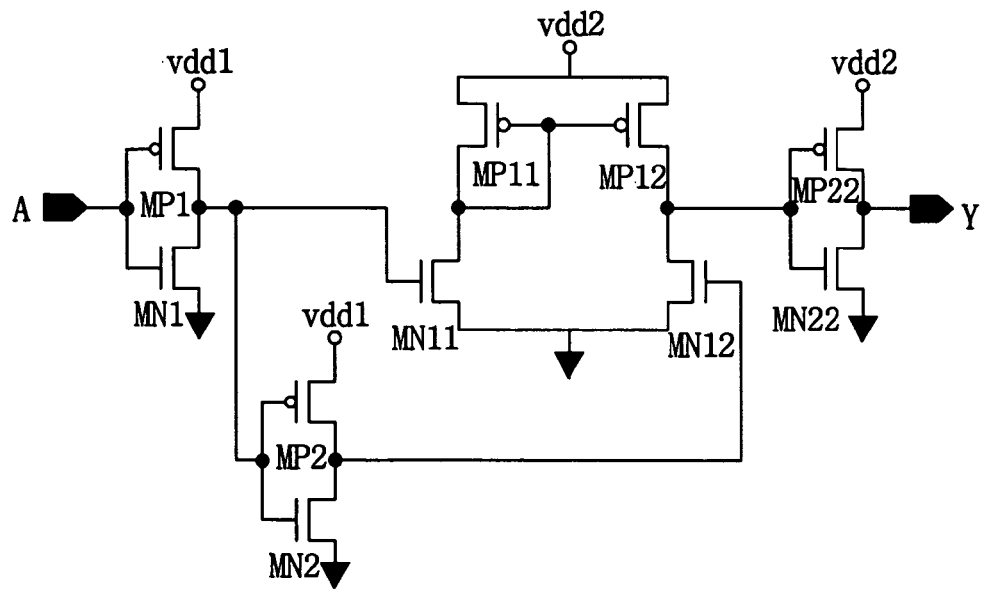
Figure 2:
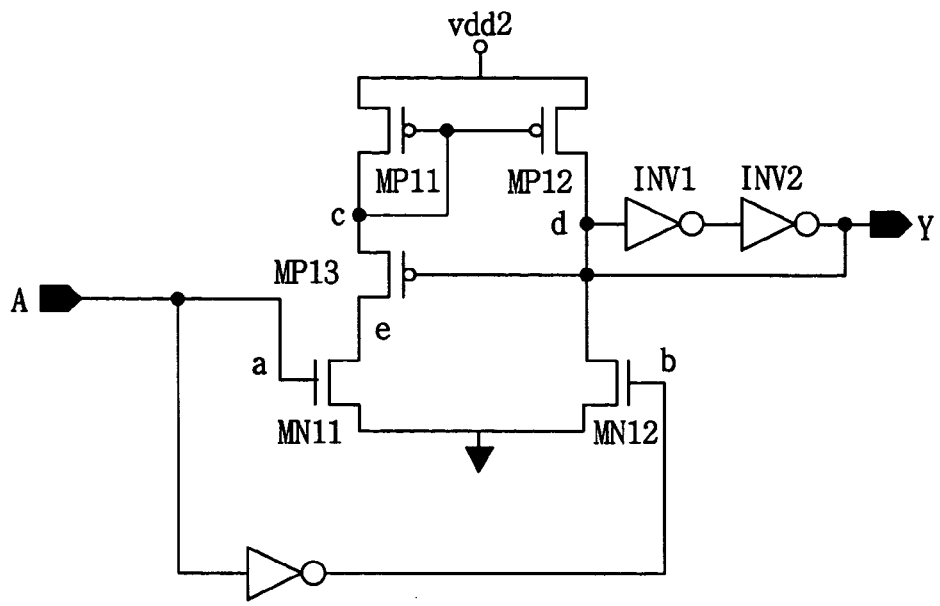
FIG. 2 is a schematic illustration of a conventional level shifter circuit.
Figure 3:
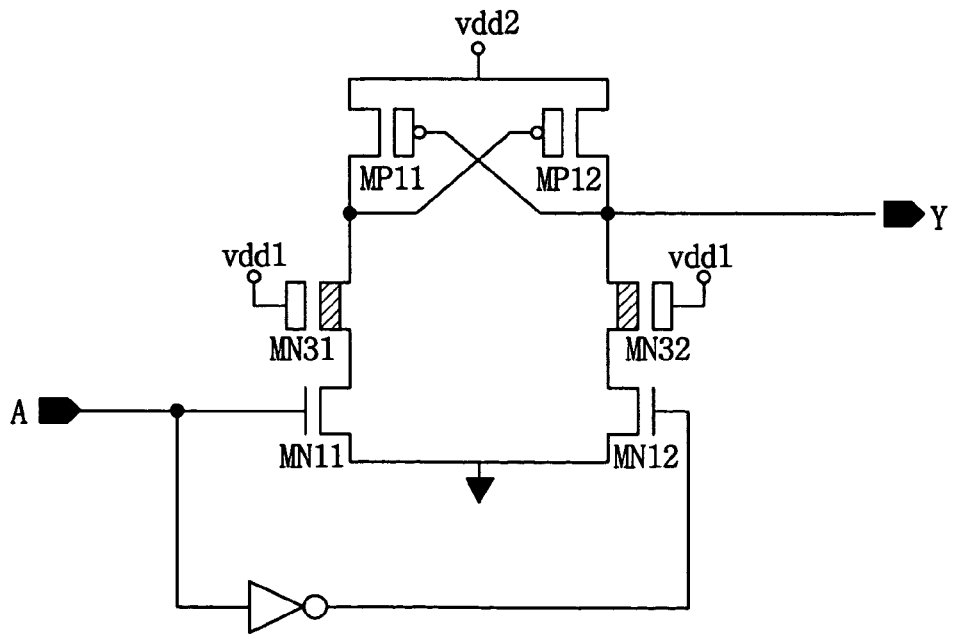
FIG. 3 is a schematic illustration of a conventional level shifter circuit.
Figure 4:
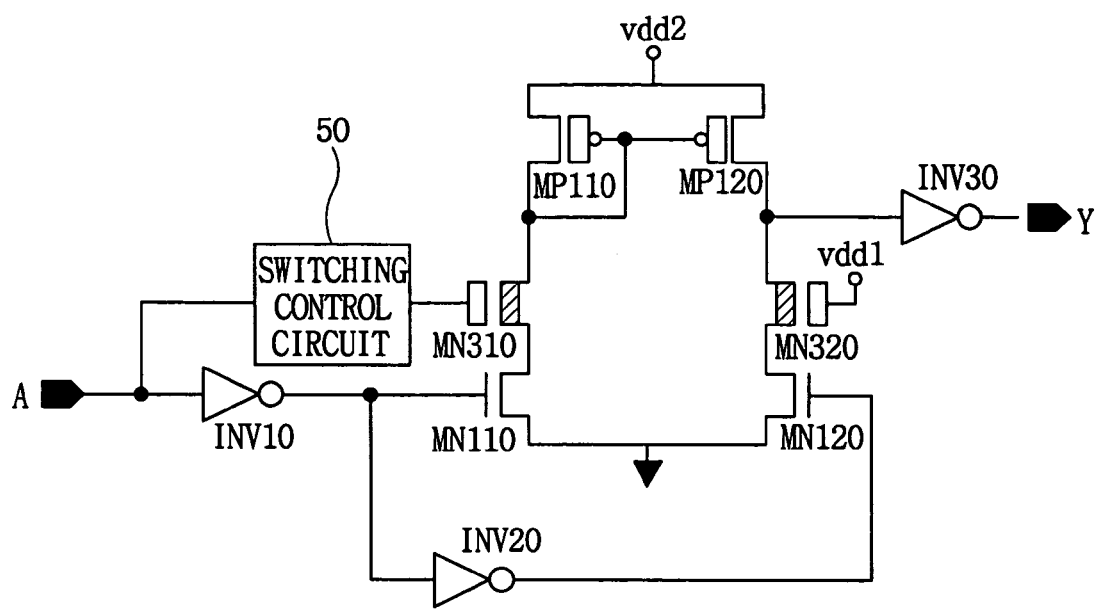
FIG. 4 is a schematic illustration of a level shifter circuit according to some embodiments of the present invention.

FIG. 4 is a schematic illustration of a level shifter circuit for shifting an input signal A from a first power domain having a first supply voltage vdd1 to a second power domain having a second supply voltage vdd2 according to some embodiments of the present invention. In some embodiments of the present invention, vdd1 is a voltage of an ultra deep submicron core portion of an integrated circuit and vdd2 is an voltage of an interface portion of the integrated circuit. For example, vdd1 may be about 1.2 volts or less. For example, for 0.13 micron technology, the core voltage may be 1.2 volts. For 90 nm technology the core voltage may be about 1 volt. In some embodiments of the present invention the second supply voltage vdd2 is greater than the first supply voltage vdd1. For example, the second supply voltage vdd2 may be about 2.5 volts. In certain embodiments of the present invention, the second supply voltage vdd2 is 3.3 volts.

As seen in FIG. 4, a mirror-type level shifter includes first and second p-type transistors MP110 and MP120 having commonly connected gates. The sources of the p-type transistors MP110 and MP120 are coupled to the higher supply voltage vdd2. The p-type transistors MP110 and MP120 are coupled to two n-type transistors MN110 and MN120 through two zero threshold transistors MN310 and MN320. The gate of the second zero threshold transistor MN320 is coupled to vdd1. The drain of the second p-type transistor MP120 is coupled to an output inverter INV30 that operates using the second supply voltage vdd2 and provides the level shifted output Y. In some embodiments of the present invention, the p-type transistors MP110 and MP120 may have an oxide thickness based on the second supply voltage vdd2, for example, 3.3 volts, with a threshold voltage of from about 0.4 to about 0.8 volts.

The zero threshold transistors MN310 and MN320 may have the same oxide thickness as the p-type transistors but may have a threshold voltage of nearly zero. Furthermore, while the zero threshold transistors MN310 and MN320 are on at nearly zero volts, they remain highly resistive. As the gate voltage is increased, the resistivity of the zero threshold transistors MN310 and MN320 is reduced. Thus, at zero volts, the zero threshold transistors MN310 and MN320 may not be fully blocking but may allow several hundred nano-ampere current. In some embodiments of the present invention, the zero threshold transistors MN310 and MN320 may be sized so that the voltage across the n-type transistor MN110 is about vdd1. The particular size of the zero threshold transistor MN310 may be a trade-off between switching speed and static current. Thus, a larger transistor may switch faster but may have greater static current. The trade-off of a particular circuit may be based, for example, on the intended use of the circuit.

The input A is provided to a gate of the first n-type transistors MN110 through a first input inverter INV10 and to a gate of the second n-type transistor MN120 through the first input inverter INV10 and a second input inverter INV20. The input inverters INV10 and INV20 utilize the first supply voltage vdd1. The n-type transistors MN110 and MN120 have a low threshold voltage for operation with the first supply voltage vdd1, and may be thin oxide transistors. In particular embodiments of the present invention, the n-type transistors MN110 and MN120 have a same oxide thickness as transistors in the first power domain, for example, transistors generating the input signal A in a core portion of an integrated circuit operating using the vdd1 supply voltage.

As is further seen in FIG. 4, a switching control circuit 50 couples the input A to the gate of the first zero threshold transistors MN310. The gate of the second zero threshold transistor MN320 is coupled to vdd1. In some embodiments, the switching control circuit 50 delays the input A by at least the delay from the input A to the output Y. For example, in the circuit illustrated in FIG. 4, the switching control circuit delays the input A about three inverter delays as a three inverter delay is present from the input A to the output Y when the input switches to a high value. The switching control circuit 50 is in the first power domain such that the gate voltage of the first zero threshold transistor MN310 switches between 0 and vdd1. Thus, in operation, the voltage level seen by the n-type transistor MN110 is a maximum of vdd1−$V_{th, MN310}$, where $V_{th, MN310}$ is the threshold voltage of MN310, which is approximately zero. Likewise, the gate voltage of the second zero threshold transistor MN320 is vdd1 and, therefore, the voltage level seen by the n-type transistor MN120 is a maximum of vdd1−$V_{th, MN320}$, where $V_{th, MN320}$ is the threshold voltage of MN320 which is approximately zero. As such, the n-type transistors MN110 and MN120 may be thin gate oxide transistors that may allow for a low threshold voltage suitable for use in, for example, ultra deep submicron technology.

Figure 5:
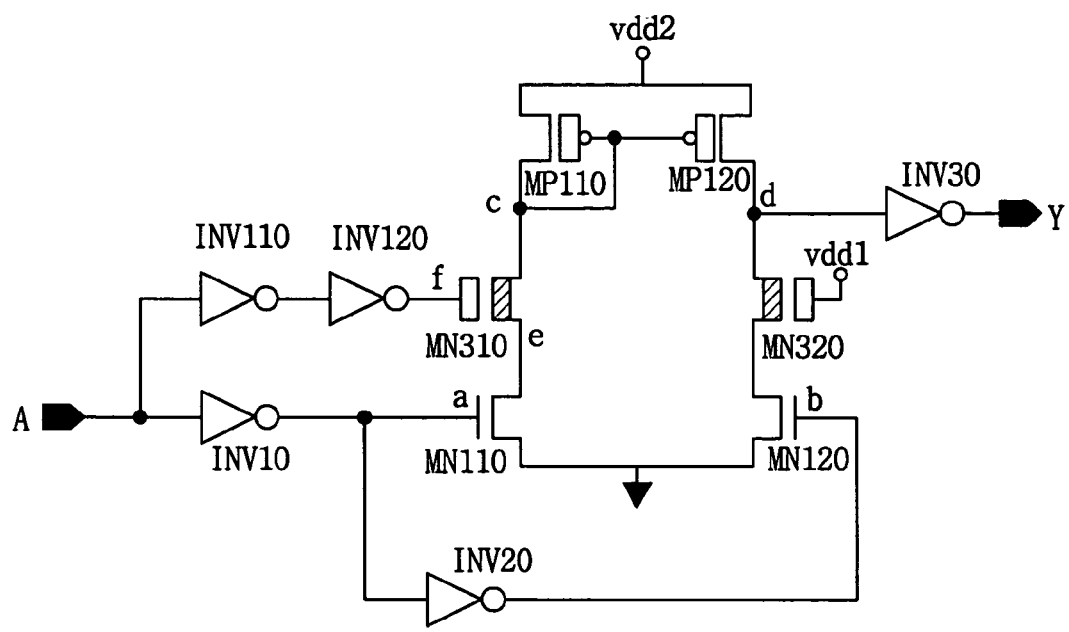
FIG. 5 is a schematic illustration of a level shifter circuit according to further embodiments of the present invention.

FIG. 5 is a schematic diagram of a level shifter circuit according to further embodiments of the present invention. In the level shifter of FIG. 5, the switching control circuit 50 of FIG. 4 is provided by series inverters INV110 and INV120. The remaining elements of the circuit of FIG. 5 are as described above with reference to FIG. 4. The inverters INV110 and INV120 are sized so that they provide a delay corresponding to the delay from A to Y and utilize the first power supply voltage vdd1. The transistors in the series inverters INV110 and INV120 may utilize a gate oxide thickness of transistors in the core of the integrated circuit.

Figure 6:
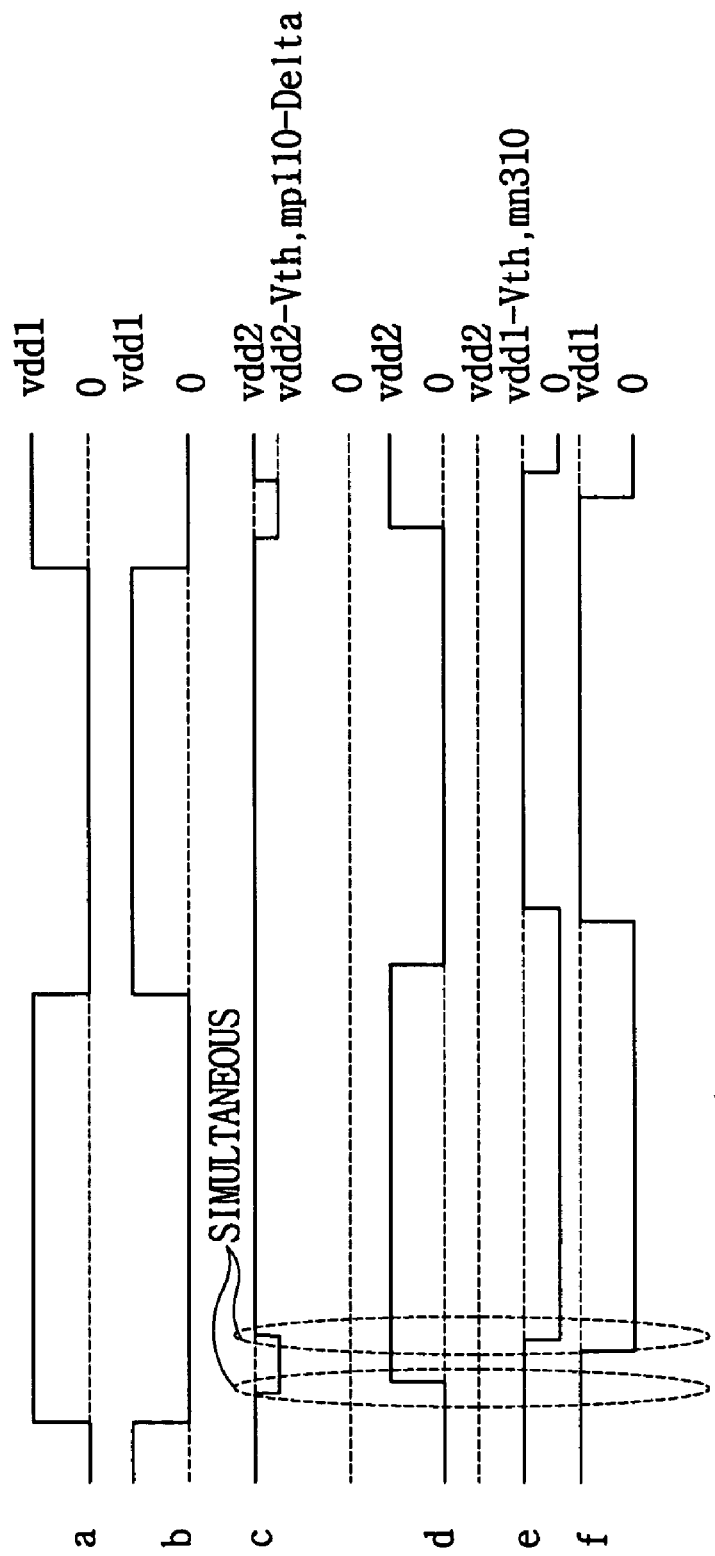
FIG. 6 is a timing diagram of the level shifter circuit of FIG. 5.

FIG. 6 is a timing diagram of the voltages at the nodes a, b, c, d, e and f in the circuit of FIG. 5. As seen in FIG. 5, the nodes a and b track the input A and switch between 0 and vdd1. Thus, when the input A switches from a high value to a low value the gate (node a) of the transistor MN110 goes from a low value (0V) to a high value (vdd1) and the gate (node b) of the transistor MN120 goes from a high value (vdd1) to a high value (0V). Thus, the transistor MN110 turns on and the transistor MN120 turns off. Because the transistors MN110 and MN120 are thin oxide transistors with a threshold voltage based on vdd1, the transistors MN110 and MN120 may be reliably switched between an on state and an off state.

When the transistor MN110 turns on, because the gate (node f) of the transistor MN310 is high (i.e. vdd1), the transistor MN310 is in a low resistance state and the node c is pulled low which turns on the transistors MP110 and MP120 and the node d is pulled high (i.e. to vdd2) and the output Y of the inverter INV30 switches to low. After the delay of the series inverters INV110 and INV120, the gate (node f) of the transistor MN310 goes low and the transistor MN310 goes to a high resistance state which reduces the current flow through the transistor MP110 and the node e goes to zero volts as the voltage at node e is $V_{g,MN310}-V_{th, MN310}$. The node c, therefore goes high and the node d remains high because the transistors MP120 and MN120 are both off.

When the input A switches from a low value to a high value the gate (node a) of the transistor MN110 goes from a high value (vdd1) to a low value (0V) and the gate (node b) of the transistor MN120 goes from a low value (0V) to a high value (vdd1). Thus, the transistor MN110 turns off and the transistor MN120 turns on. When the transistor MN120 turns on, because the transistor MP120 is off and the transistor MN320 is in a low resistance state, the node d is pulled low which causes the output Y to go high.

Thus, as seen in FIG. 6, the gate of the zero threshold transistor MN310 is a delayed version of the input signal A and, therefore, reduces the static current through the transistors MP110 and MN110 by transitioning the zero threshold transistor MN310 from a low resistance state to a high resistance state after sufficient time has passed to transition the output Y from a high state to a low state.

Figure 7:
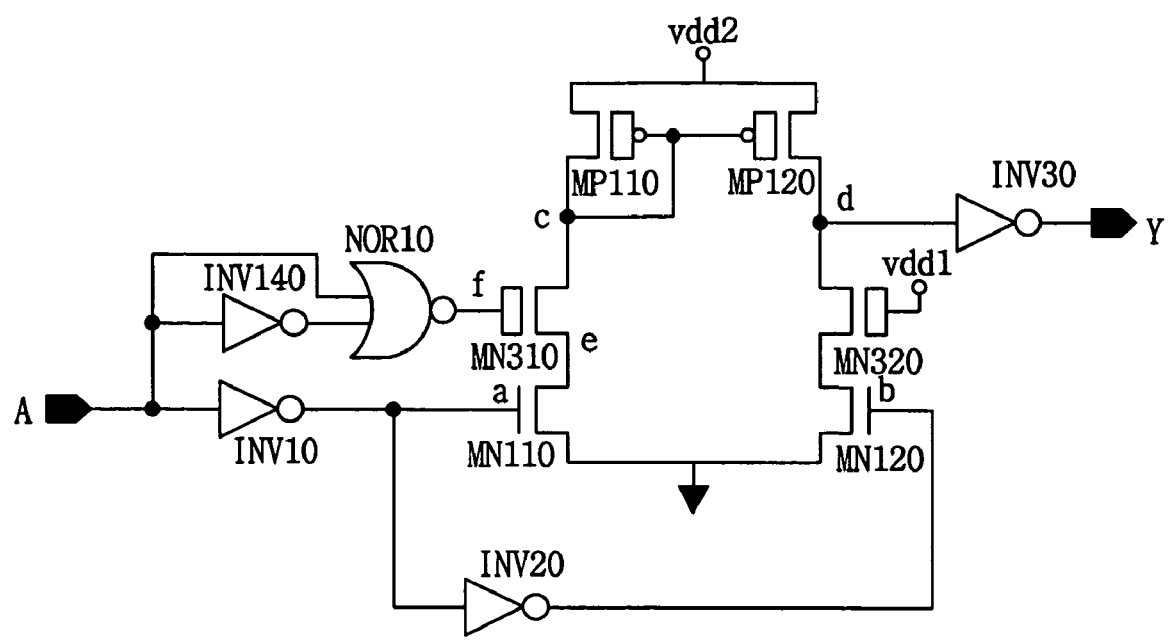
FIG. 7 is a schematic illustration of a level shifter circuit according to further embodiments of the present invention.

FIG. 7 is a schematic diagram of a level shifter circuit according to further embodiments of the present invention. In the level shifter of FIG. 7, the switching control circuit 50 of FIG. 4 is provided by an inverter INV140 and a NOR gate NOR10. The remaining elements of the circuit of FIG. 7 are as described above with reference to FIGS. 4 and 5. The inverter INV140 and/or NOR gate NOR10 are sized so that they provide a delay corresponding to the delay from A to Y and utilize the first power supply voltage vdd1. In some embodiments of the present invention, the delay of the inverter INV140 and/or NOR gate NOR10 is at least the delay from A to Y. The transistors in the inverter INV140 and NOR gate NOR10 may utilize a gate oxide thickness of transistors in the core of the integrated circuit.

In the circuit of FIG. 5, when the input signal A is high, the node f is high and the node a is low and only the transistor MN110 blocks the current through the transistor MP110. Thus, if the leakage current through the transistor MN110 is large, a static current may result. However, utilizing the circuit of FIG. 7, both the transistor MN110 and the transistor MN310 may block current through the transistor MP110. Thus, any static current may be reduced and/or eliminated.

Figure 8:
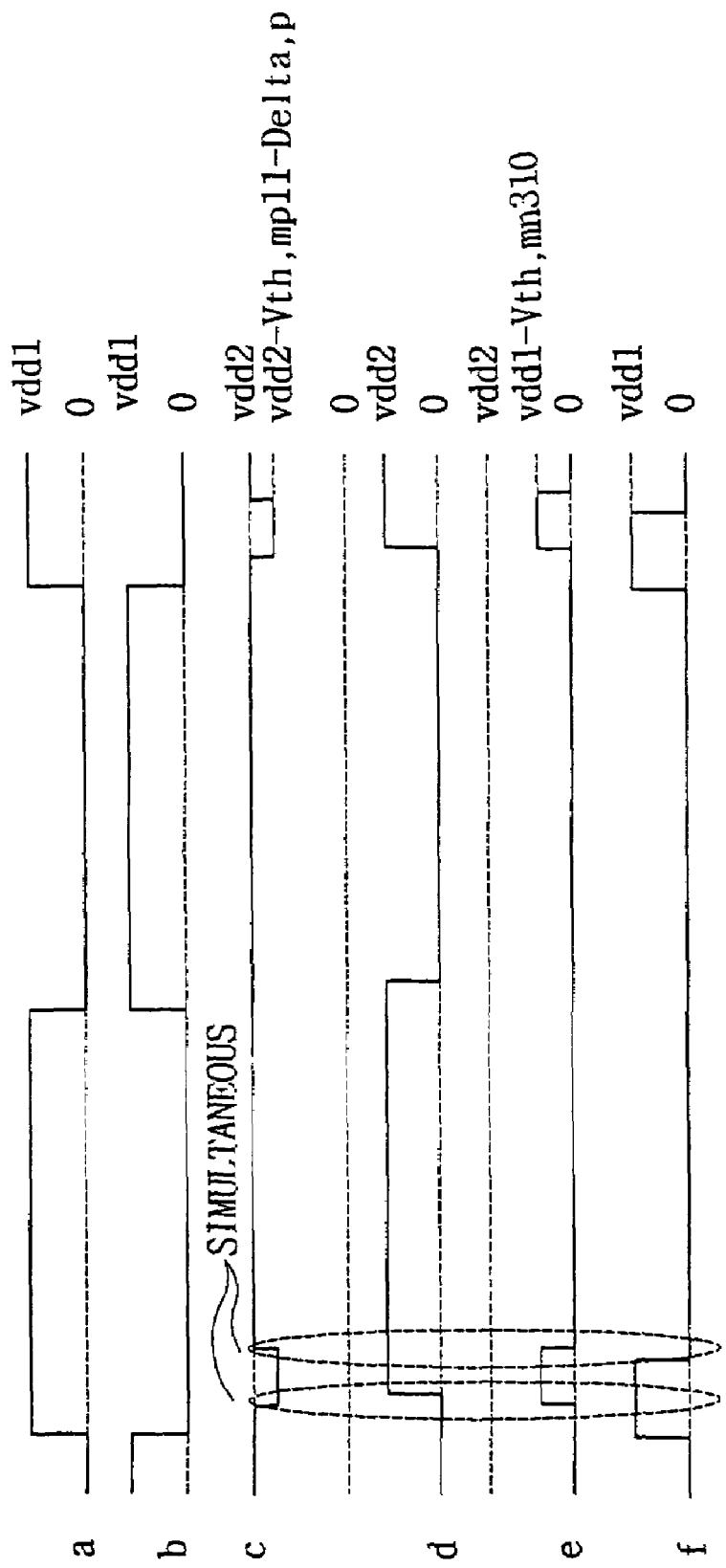
FIG. 8 is a timing diagram of the level shifter circuit of FIG. 7.

FIG. 8 is a timing diagram of the voltages at the nodes a, b, c, d, e and f in the circuit of FIG. 7. As seen in FIG. 7, when the input A is at a high value, the inputs to the NOR gate NOR10 are the high value of the input A and the low value of the inverter INV140. Thus, the output of the NOR gate NOR10 is low and, therefore, node f is low and the transistor MN310 is in a high resistance state. When the input A goes from a high value to a low value, the inputs to the NOR gate NOR10 go from a high value and a low value to two low values and the node f goes high, thus transitioning the transistor MN310 to a low resistance state. After the delay of the inverter INV140, the input to the NOR gate NOR10 goes high and the output of the NOR gate NOR10 goes low and, therefore, node f is low and the transistor MN310 transitions to a high resistance state. When the input signal A transitions from a low value to a high value, an input to the NOR gate NOR10 is at a high value so the output of the NOR gate NOR10 remains low as does the node f. Thus, the transistor MN310 and the transistor MN110 both block current through the transistor MP110.

The pulse width of the voltage reflected at node f may be established by the delay through the inverter INV40. Accordingly, in some embodiments of the present invention, the delay through the inverter INV40 may be set to at least the delay from the input A to the output Y. Thus, the pulse width at node f will be sufficient in duration to provide for switching the output state of the circuit before transitioning to the transistor MN310 to a high resistance state.

Figure 9:
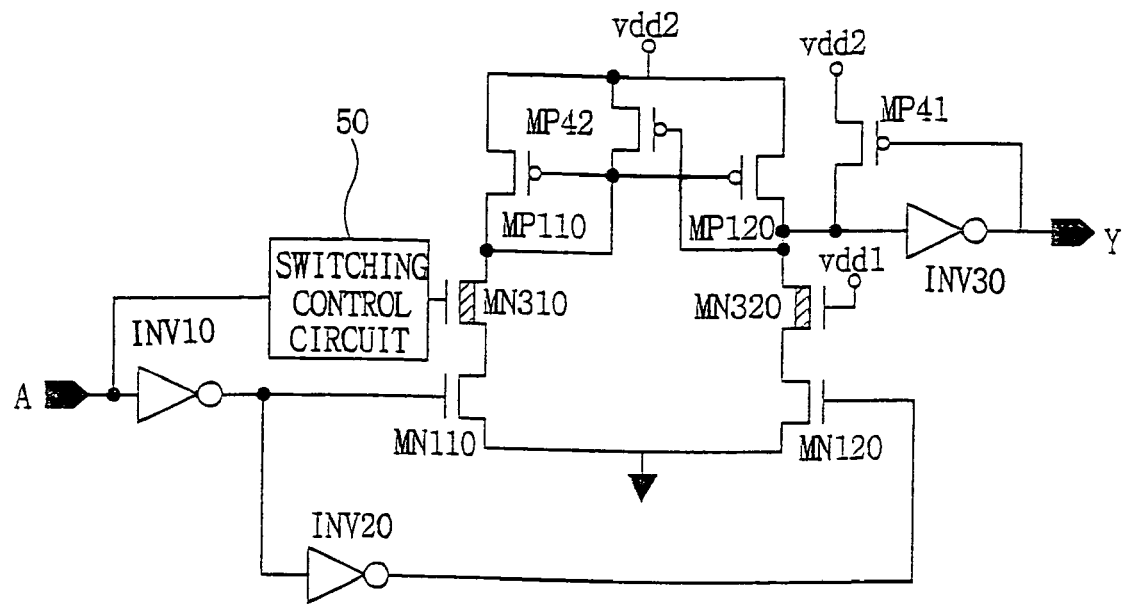
FIGS. 9 through 12 are schematic illustrations of level shifter circuits according to additional embodiments of the present invention.

FIG. 9 is a schematic diagram of a level shifter circuit according to further embodiments of the present invention. In the level shifter of FIG. 9, a p-type transistor MP41 and a p-type transistor MP42 are added. The p-type transistor MP41 is provided that pulls the input to the inverter INV30 to vdd2 when the output of the inverter INV30 is low. When the output of the inverter INV30 is low, both MN120 and MP120 are off so that the input to the inverter INV30 is in a floating state. In this case, if the leakage of MN120 is greater than that of MP120, the voltage of the input to the inverter INV30 may drop. The voltage drop in the input to the inverter INV30 may cause an increase of the static current through INV30 and, furthermore, may switch the output from a low state to a high state. This feedback transistor may reduce the likelihood of those kinds of malfunction. The p-type transistor MP42 is provided that pulls the gates of both MP110 and MP120 to vdd2 when the MN120 is on. When MN120 is on, the gate of MP110 and MP120 is in a floating state so that leakage current through MP120 may exist. The transistor MP42 pulls the gates of MP110 and MP120 up to vdd2, when MN120 is on, so that the leakage current through MP42 may be reduced and/or eliminated.

Figure 10:
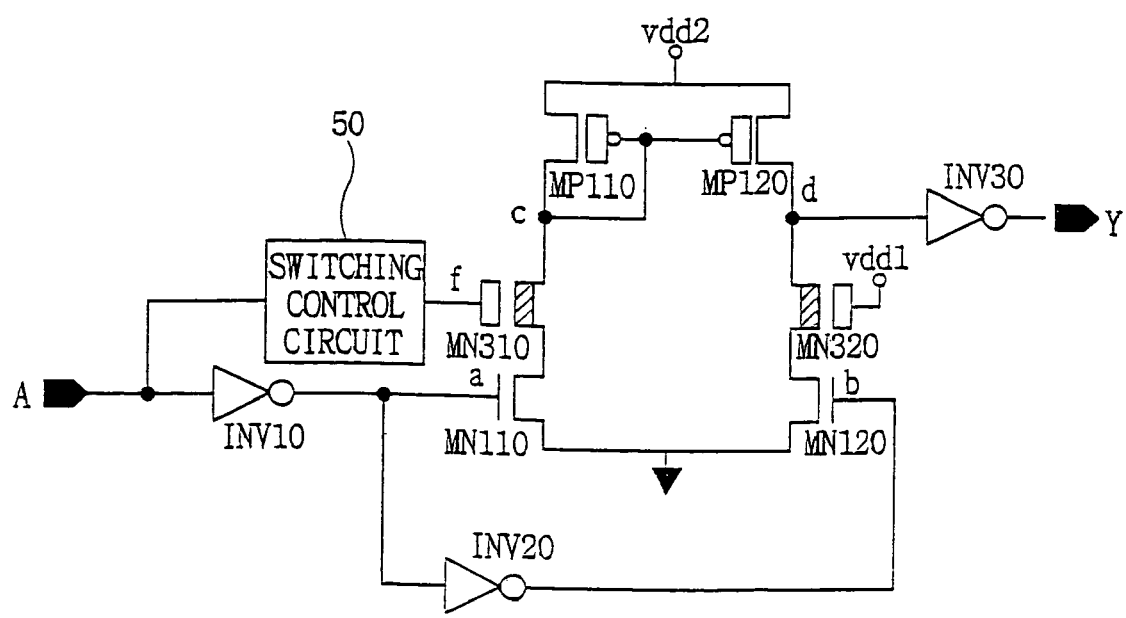

FIG. 10 is a schematic diagram of a level shifter circuit according to further embodiments of the present invention. In the level shifter of FIG. 10, the output of the inverter INV20 is also coupled to the gate of the second zero threshold transistor MN320. Thus, when the transistor MN120 is turned off, the second zero threshold transistor MN320 is in a high resistance state and when the transistor MN120 is turned on, the second zero threshold transistor MN320 is in a low resistance state. Thus, both the transistor MN120 and the transistor MN320 may block through the transistor MP120. Thus, any static current resulting, for example, from a large leakage current through the transistor MN120, may be reduced and/or eliminated.

Figure 11:
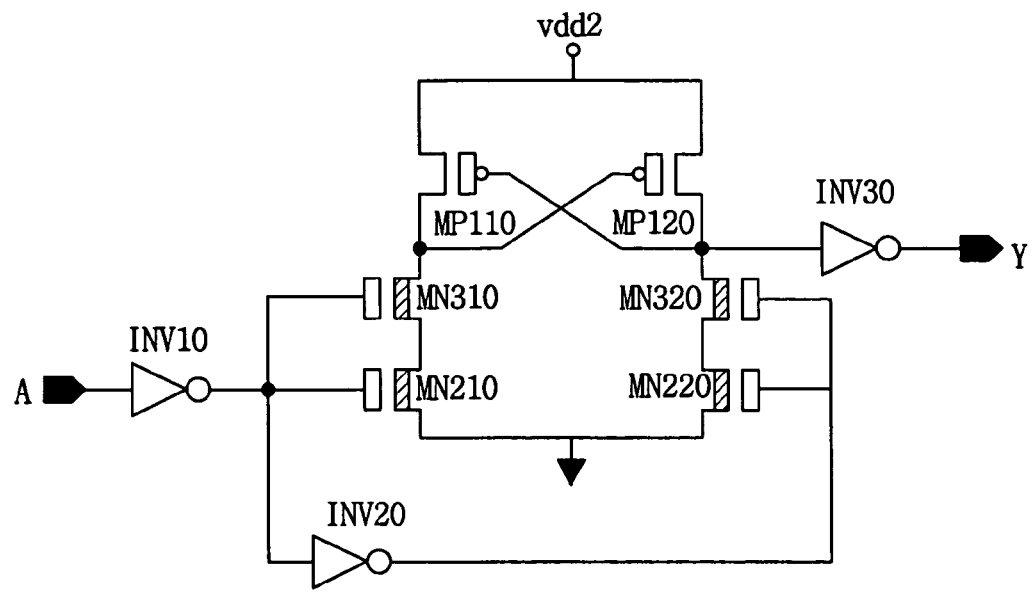
Figure 12:
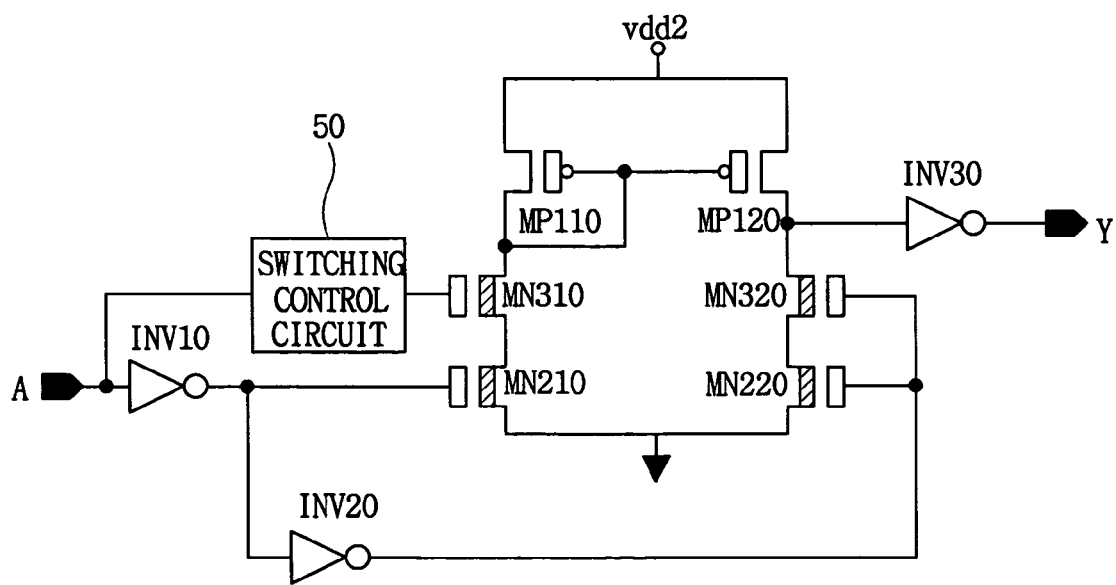

Further embodiments of the present invention are illustrated in FIGS. 11 and 12, where thick oxide series zero threshold transistors are utilized to reduce leakage current and to switch between a high resistance state and a low resistance state utilizing the lower voltages of the first supply voltage vdd1. FIG. 11 illustrates a latch-type level shifter utilizing series zero threshold transistors MN310, MN210 and MN320, MN220. FIG. 12 illustrates a mirror-type level shifter utilizing series zero threshold transistors MN310, MN210 and MN320, MN220.

Turning to FIG. 11, a level shifter for shifting an input signal from a first power domain having a first supply voltage (vdd1) to a second power domain having a second supply voltage (vdd2) includes first and second cross-coupled p-type transistors MP110 and MP120 coupled to the second supply voltage vdd2. First and second zero threshold n-type transistors MN320 and MN220 are serially coupled to the first p-type transistor MP120 and are responsive to the input signal A. Third and fourth zero threshold n-type transistors MN310 and MN210 are serially coupled to the second p-type transistor MP110 and responsive to an inverted phase of the input signal A. Thus, the input signal A is provided to the gates of the first and second zero threshold n-type transistors MN320 and MN220 through the first and second serially connected inverters INV10 and INV20. The inverted phase of the input signal A is provided to the gates of the third and fourth zero threshold n-type transistors MN310 and MN210 through the first inverter INV10. The output is provided as an inverted form of the voltage between the second p-type transistor MP120 and the first zero threshold transistor MN320.

With regard to FIG. 12, a level shifter for shifting an input signal from a first power domain having a first supply voltage (vdd1) to a second power domain having a second supply voltage (vdd2) includes first and second p-type transistors MP110 and MP120 coupled to the second supply voltage vdd2 and having connected gate electrodes. First and second zero threshold n-type transistors MN320 and MN220 are serially coupled to the first p-type transistor MP120 and are responsive to the input signal A. Third and fourth zero threshold n-type transistors MN310 and MN210 are serially coupled to the second p-type transistor MP110 and responsive to an inverted phase of the input signal A. Thus, the input signal A is provided to the gates of the first and second zero threshold n-type transistors MN320 and MN220 through the first and second serially connected inverters INV10 and INV20. The inverted phase of the input signal A is provided to the gates of the third and fourth zero threshold n-type transistors MN310 and MN210 through the first inverter INV10. The output is provided as an inverted form of the voltage between the second p-type transistor MP120 and the first zero threshold transistor MN320.

In the circuits of FIGS. 11 and 12, the zero threshold transistors may have an oxide thickness substantially the same as that of the p-type transistors. Because the oxide thickness of the zero threshold transistors may be the same as that of the remainder of the output circuit, circuit layout may be simplified. Furthermore, reliability issues associated with using thin oxide transistors may be avoided. However, because the transistors are zero threshold transistors, vdd1 may be sufficiently greater than the threshold voltage of the transistors so as to increase switching reliability over conventional transistors.

In operation, the zero threshold transistors MN310 and MN210 are operated in parallel and the zero threshold transistors MN320 and MN220 are operated in parallel. The zero threshold transistor pairs may provide lower leakage current over use of a single zero threshold transistor. The zero threshold transistor MN310 may be sized based on a trade-off of increased leakage current versus faster turn-on speed where the greater the leakage current the faster the turn-on speed.

The switching control circuit 50 of FIG. 12 may be provided as any of the switching control circuits described above. Furthermore, combinations of the embodiments of the present invention may also be provided. For example, the feedback transistors MP41 and MP42 of FIG. 9 may be provided in any of the circuits of FIGS. 5, 7, 10 or 12. Likewise, the serial inverters INV110 and INV120 or the inverter INV140 and the NOR gate NOR10 may be provided as the switching control circuits 50 of FIGS. 9, 10 or 12. Accordingly, embodiments of the present invention should not be construed as limited to the particular circuit configurations of the examples illustrated herein.

While the present invention has been particularly shown and described with reference to particular embodiments thereof, it will be understood by those of ordinary skill in the art that various changes in form and details may be made therein without departing from the spirit and scope of the present invention as defined by the following claims.

What is claimed is:

1. A level shifter for shifting an input signal from a first power domain having a first supply voltage to a second power domain having a second supply voltage, comprising:
   a current mirror circuit that provides an output signal in the second power domain, the current mirror comprising:
      first and second p-type transistors coupled to the second supply voltage;
      first and second zero threshold n-type transistors coupled to respective ones of the first and second p-type transistors; and
      first and second n-type transistors coupled to respective ones of the first and second p-type transistors through respective ones of the first and second zero threshold transistors, the first and second n-type transistors having a threshold voltage based on the first supply voltage; and
   a switching control circuit utilizing the first supply voltage that controls the first zero threshold transistor responsive to the input signal.

2. The level shifter circuit of claim 1, wherein the switching control circuit comprises a delay circuit configured to delay the input signal to provide a delayed input signal to control the first zero threshold transistor.

3. The level shifter of claim 2, wherein the delay circuit has a delay corresponding to a delay between a transition in the input signal and a corresponding transition in the output signal.

4. The level shifter of claim 1, wherein a voltage between the source and drain of the first and second n-type transistors is limited to the first supply voltage minus a threshold voltage of the corresponding first and second zero threshold transistors.

5. A level shifter for shifting an input signal from a first power domain having a first supply voltage to a second power domain having a second supply voltage, comprising:
   a current mirror circuit that provides an output signal in the second power domain, the current mirror comprising:
      first and second p-type transistors coupled to the second supply voltage;
      first and second zero threshold n-type transistors coupled to respective ones of the first and second p-type transistors; and first and second n-type transistors coupled to respective ones of the first and second p-type transistors through respective ones of the first and second zero threshold transistors, the first and second n-type transistors having a threshold voltage based on the first supply voltage;

a switching control circuit utilizing the first supply voltage that controls the first zero threshold transistor responsive to the input signal, wherein the switching control circuit comprises a delay circuit configured to delay the input signal to provide a delayed input signal to control the first zero threshold transistor;

a first inverter utilizing the first supply voltage and configured to receive the input signal and provide an inverted input signal to the first n-type transistor;

a second inverter utilizing the first supply voltage and configured to receive the inverted input signal and provide a buffered input signal to the second n-type transistor; and a third inverter utilizing the second supply voltage and to provide the output signal.

6. The level shifter of claim 5, wherein the delay circuit comprises at least two series inverters utilizing the first supply voltage.

7. The level shifter of claim 5, wherein the delay circuit comprises:
a fourth inverter utilizing the first supply voltage and configured to receive the input signal and provide a second inverted input signal;
a NOR gate utilizing the first supply voltage and configured to receive the input signal and the second inverted input signal and provide a logical NOR of the input signal and the second inverted input signal to the first zero threshold transistor.

8. The level shifter of claim 5, further comprising a third p-type transistor having a gate coupled to the output of the third inverter and that couples the second supply voltage to the input of the third inverter.

9. The level shifter of claim 5, further comprising a fourth p-type transistor having a gate coupled to the input of the third inverter and couples the second supply voltage to the gates of the first and the second p-type transistors.

10. The level shifter of claim 5, wherein a gate of the second zero threshold transistor is coupled to the output of the second inverter.

11. The level shifter of claim 5, wherein a gate of the second zero threshold transistor is coupled to the first supply voltage.

12. The level shifter of claim 5, wherein the delay circuit has a delay corresponding to a delay between a transition in an output of the first inverter and a corresponding transition in the output signal.

13. A level shifter for shifting an input signal from a first power domain having a first supply voltage to a second power domain having a second supply voltage, comprising:
first and second cross-coupled p-type transistors coupled to the second supply voltage;
first and second zero threshold n-type transistors serially coupled to the first p-type transistor and responsive to an inverted input signal; and
third and fourth zero threshold n-type transistors serially coupled to the second p-type transistor and responsive to an buffered input signal.

14. The level shifter of claim 13, wherein a gate oxide of the first and second cross-coupled p-type transistors and the first, second, third and fourth zero threshold transistors is substantially the same.

15. The level shifter of claim 13, further comprising:
a first inverter utilizing the first supply voltage and configured to receive the input signal and provide the inverted input signal to the first and second zero threshold transistors;
a second inverter utilizing the first supply voltage and configured to receive the inverted input signal and provide the buffered input signal to the third and fourth zero threshold transistors; and
a third inverter utilizing the second supply voltage and to provide the output signal.

16. A level shifter for shifting an input signal from a first power domain having a first supply voltage to a second power domain having a second supply voltage, comprising:
first and second p-type transistors coupled to the second supply voltage having connected gate electrodes;
first and second zero threshold n-type transistors serially coupled to the first p-type transistor and responsive to an inverted input signal;
third and fourth zero threshold n-type transistors serially coupled to the second p-type transistor and responsive to an buffered input signal; and
a switching control circuit utilizing the first supply voltage that controls the first zero threshold transistor responsive to the input signal.

17. The level shifter of claim 16, wherein a gate oxide of the first and second p-type transistors and the first, second, third and fourth zero threshold transistors is substantially the same.

18. The level shifter of claim 16, further comprising:
a first inverter utilizing the first supply voltage and configured to receive the input signal and provide the inverted input signal to the first and second zero threshold transistors;
a second inverter utilizing the first supply voltage and configured to receive the inverted input signal and provide the buffered input signal to the third and fourth zero threshold transistors; and
a third inverter utilizing the second supply voltage and to provide the output signal.

19. The level shifter of claim 18, wherein the switching control circuit comprises at least two series inverters utilizing the first supply voltage.

20. The level shifter of claim 18, wherein the switching control circuit comprises:
a fourth inverter utilizing the first supply voltage and configured to receive the input signal and provide a second inverted input signal;
a NOR gate utilizing the first supply voltage and configured to receive the input signal and the second inverted input signal and provide a logical NOR of the input signal and the second inverted input signal to the first zero threshold transistor.

21. The level shifter of claim 18, further comprising a third p-type transistor having a gate coupled to the output of the third inverter and that couples the second supply voltage to the input of the third inverter.

22. The level shifter of claim 18, further comprising a fourth p-type transistor having a gate coupled to the input of the third inverter and couples the second supply voltage to the gates of the first and the second p-type transistors.

23. The level shifter of claim 16, wherein the switching control circuit comprises a delay circuit that has a delay corresponding to a delay between a transition in the input signal and a corresponding transition in the output signal.

* * * * *